US009703905B2

(12) United States Patent
Ye et al.

(10) Patent No.: US 9,703,905 B2
(45) Date of Patent: Jul. 11, 2017

(54) METHOD AND SYSTEM FOR SIMULATING MULTIPLE PROCESSORS IN PARALLEL AND SCHEDULER

(71) Applicant: Huawei Technologies Co., Ltd., Shenzhen, Guangdong (CN)

(72) Inventors: Handong Ye, Shenzhen (CN); Jiong Cao, Shenzhen (CN); Xiaochun Ye, Shenzhen (CN); Da Wang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 865 days.

(21) Appl. No.: 14/142,567

(22) Filed: Dec. 27, 2013

(65) Prior Publication Data

US 2014/0114640 A1    Apr. 24, 2014

Related U.S. Application Data

(63) Continuation of application No. PCT/CN2012/081353, filed on Sep. 13, 2012.

(30) Foreign Application Priority Data

Sep. 13, 2011    (CN) .......................... 2011 1 0269208

(51) Int. Cl.
  *G06F 17/50*    (2006.01)
  *G06F 11/26*    (2006.01)
(52) U.S. Cl.
  CPC ........ *G06F 17/5022* (2013.01); *G06F 11/261* (2013.01)
(58) Field of Classification Search
  USPC ....... 703/14, 22, 24; 716/102, 103, 106, 108
  See application file for complete search history.

(56) References Cited

U.S. PATENT DOCUMENTS 5,692,193 A * 11/1997 Jagannathan ........... G06F 8/451
                                                         711/6
5,870,588 A *  2/1999 Rompaey ............ G06F 17/5045
                                                         703/13

(Continued)

FOREIGN PATENT DOCUMENTS

CN      1979445 A      6/2007
CN    101183315 A      5/2008

(Continued)

OTHER PUBLICATIONS

Kim et al., "CORBA-Based, Multi-threaded Distributed Simulation of Hierarchical DEVS Models: Transforming Model Structure into a Non-hierarchical One," Computational Science and Its Applications—ICCSA 2004: International Conference, Assisi, Italy, May 14-17, 2004, Proceedings, Part IV, vol. 3026, pp. 167-176 (May 14-17, 2004).

*Primary Examiner* — Thai Phan
(74) *Attorney, Agent, or Firm* — Leydig, Voit & Mayer, Ltd.

(57) ABSTRACT

The present invention provides a method and a system for simulating multiple processors in parallel, and a scheduler. In this embodiment, the scheduler maps debug interface information of a to-be-simulated processor requiring debugging onto the scheduler during parallel simulation of multiple processors, so that the scheduler is capable of debugging, by using a master thread, the to-be-simulated processor requiring debugging via a debug interface of the to-be-simulated processor requiring debugging pointed by the debug interface information, thereby implementing debugging during parallel simulation of multiple processors.

20 Claims, 6 Drawing Sheets

(56) References Cited

U.S. PATENT DOCUMENTS

| | | | |
|---|---|---|---|
| 6,263,302 B1 | 7/2001 | Hellestrand et al. | |
| 6,466,898 B1 * | 10/2002 | Chan | G06F 17/5022 703/14 |
| 2006/0229861 A1 | 10/2006 | Tatsuoka et al. | |
| 2010/0332202 A1 | 12/2010 | Nakhla et al. | |
| 2012/0131309 A1 * | 5/2012 | Johnson | G06F 9/30 712/41 |
| 2013/0231912 A1 * | 9/2013 | Ye | G06F 11/261 703/21 |

FOREIGN PATENT DOCUMENTS

| CN | 101777007 A | 7/2010 |
|---|---|---|
| CN | 101873338 A | 10/2010 |
| CN | 102331961 A | 1/2012 |

\* cited by examiner

METHOD AND SYSTEM FOR SIMULATING MULTIPLE PROCESSORS IN PARALLEL AND SCHEDULER

CROSS-REFERENCE TO RELATED APPLICATION

This application is a continuation of International Patent Application No. PCT/CN2012/081353, filed on Sep. 13, 2012, which claims priority to Chinese Patent Application No. 201110269208.X, filed on Sep. 13, 2011, both of which are hereby incorporated by reference in their entireties.

TECHNICAL FIELD

Embodiments of the present invention relate to simulation technologies, and in particular, to a method and system for simulating multiple processors in parallel, and a scheduler.

BACKGROUND

A SIMICS simulator is a system simulator with high performance, which can simulate a single-processor system and a multi-processor system. When simulating a multi-processor system, the SIMICS simulator performs scheduling in a single-processor scheduling manner, that is, one processor is scheduled at a time to execute a corresponding instruction, so as to implement serial simulation of multiple processors.

However, because only one processor is scheduled at a time, parallel simulation of multiple processors cannot be implemented, causing reduction of the simulation efficiency. Meanwhile, in the prior art, debugging during parallel simulation of multiple processors cannot be implemented.

SUMMARY

Embodiments of the present invention provide a method and a system for simulating multiple processors in parallel and a scheduler, so as to improve simulation efficiency and implement debugging during parallel simulation of multiple processors.

In one aspect, a method for simulating multiple processors in parallel is provided, which includes:

mapping, by a scheduler, debug interface information of a to-be-simulated processor requiring debugging onto the scheduler;

creating, by the scheduler, at least one slave thread by using a master thread, and determining to-be-simulated processors corresponding to the master thread and the at least one slave thread, so as to obtain the determined corresponding to-be-simulated processors, where the to-be-simulated processor corresponding to the master thread includes the to-be-simulated processor requiring debugging; and invoking, by the scheduler, by using the master thread and the at least one slave thread via a first execute interface, the determined corresponding to-be-simulated processors to execute a corresponding instruction, and debugging the to-be-simulated processor requiring debugging by using the master thread via a debug interface of the to-be-simulated processor requiring debugging, where the first execute interface registers with the scheduler through the determined corresponding to-be-simulated processors, and the debug interface information points to the debug interface.

In another aspect, a scheduler is provided, which includes:

a mapping unit, configured to map debug interface information of a to-be-simulated processor requiring debugging onto the scheduler;

a creation unit, configured to create at least one slave thread by using a master thread, and determine to-be-simulated processors corresponding to the master thread and the at least one slave thread, so as to obtain the determined corresponding to-be-simulated processors, where the to-be-simulated processor corresponding to the master thread includes the to-be-simulated processor requiring debugging; and an invocation unit, configured to invoke, via a first execute interface by using the master thread and the at least one slave thread created by the creation unit, the corresponding to-be-simulated processors determined by the creation unit to execute a corresponding instruction, and debug, by using the master thread via a debug interface of the to-be-simulated processor requiring debugging, the to-be-simulated processor requiring debugging, where the first execute interface registers with the scheduler through the determined corresponding to-be-simulated processors, and the debug interface information mapped by the mapping unit points to the debug interface.

In another aspect, a system for simulating multiple processors in parallel is provided, which includes a to-be-simulated processor and the scheduler.

As can be seen from the foregoing technical solutions, a scheduler creates at least one slave thread by using a master thread, and determines to-be-simulated processors corresponding to the master thread and the at least one slave thread, so that the scheduler is capable of invoking, by using the master thread and the at least one slave thread via a first execute interface that is registered with the scheduler through the determined corresponding to-be-simulated processors, the determined corresponding to-be-simulated processors to execute a corresponding instruction. The to-be-simulated processors can be scheduled by using the master thread and the at least one slave thread at a time, so parallel simulation of multiple processors can be implemented, which avoids the problem in the prior art that parallel simulation of multiple processors cannot be implemented because one to-be-simulated processor is scheduled at a time, thereby improving the simulation efficiency. Meanwhile, processor resources of a host machine where the scheduler is located can be fully used, thereby improving resource utilization efficiency. In addition, the scheduler maps debug interface information of a to-be-simulated processor requiring debugging onto the scheduler, so that the scheduler is capable of debugging the to-be-simulated processor requiring debugging by using the master thread via a debug interface of the to-be-simulated processor requiring debugging pointed by the debug interface information, thereby implementing debugging during parallel simulation of multiple processors.

BRIEF DESCRIPTION OF DRAWINGS

To illustrate the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

To make the objectives, technical solutions, and advantages of the embodiments of the present invention more comprehensible, the following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Figure 1:
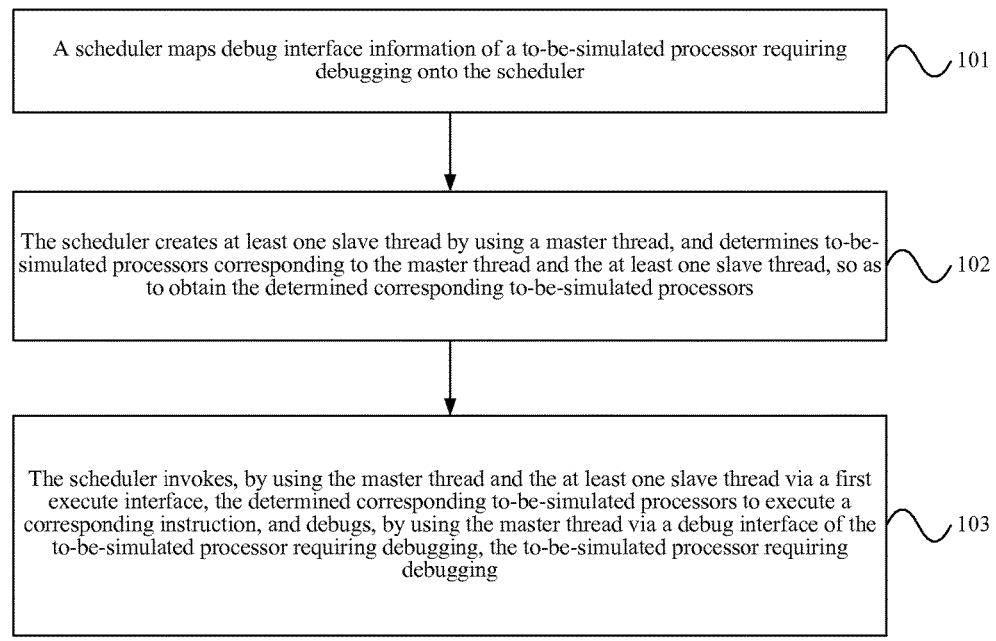
FIG. 1 is a schematic flow chart of a method for simulating multiple processors in parallel according to an embodiment of the present invention.

FIG. 1 is a schematic flow chart of a method for simulating multiple processors in parallel according to an embodiment of the present invention. As shown in FIG. 1, the method for simulating multiple processors in parallel in this embodiment may include:

101: A scheduler maps debug interface information of a to-be-simulated processor requiring debugging onto the scheduler.

102: The scheduler creates at least one slave thread by using a master thread, and determines to-be-simulated processors corresponding to the master thread and the at least one slave thread to obtain determined corresponding to-be-simulated processors.

The to-be-simulated processor corresponding to the master thread includes the to-be-simulated processor requiring debugging.

Only one master thread exists, and the maximum number of the slave threads may be equal to a result obtained by subtracting 1 from the number of processors of a host machine where the scheduler is located, so that each thread corresponds to one processor of the host machine.

Specifically, the scheduler may create at least one slave thread according to a configuration file by using the master thread, and determine the to-be-simulated processors corresponding to the master thread and the at least one slave thread. The configuration file may include, but is not limited to, the number of the created slave threads, number information of the to-be-simulated processor requiring debugging and a mapping between the thread (the master thread or the slave thread) and the to-be-simulated processor.

103: The scheduler invokes, by using the master thread and the at least one slave thread via a first execute interface (execute interface), the determined corresponding to-be-simulated processors to execute a corresponding instruction, and debugs the to-be-simulated processor requiring debugging by using the master thread via a debug interface of the to-be-simulated processor requiring debugging.

The first execute interface registers with the scheduler through the determined corresponding to-be-simulated processors; the debug interface information points to the debug interface.

It may be understood that, each thread may correspond to one to-be-simulated processor, or may correspond to multiple to-be-simulated processors, which is not limited in this embodiment, but the to-be-simulated processor corresponding to the master thread must include the to-be-simulated processor requiring debugging. If each thread corresponds to multiple to-be-simulated processors, in 102, each time the scheduler schedules, by using the master thread and the slave thread, the to-be-simulated processors to execute a corresponding instruction, the scheduler may firstly perform parallel scheduling on one to-be-simulated processor in every thread, and then perform serial scheduling on the other to-be-simulated processors in the thread inside each thread.

Optionally, the instruction may include, but is not limited to, at least one of the following instructions: an instruction of accessing a memory, including an instruction used for accessing the same memory or different memories; and an instruction of accessing a peripheral, including an instruction used for accessing the same peripheral or different peripherals.

Optionally, the instruction may also be an atomic instruction. Then in 102, the scheduler may specifically invoke, by using a mutex locking operation, the determined corresponding to-be-simulated processors to execute a corresponding instruction.

Optionally, in this embodiment, the scheduler may further deliver, by using the master thread and the at least one slave thread via a first cycle interface (cycle interface), a cycle parameter to the determined corresponding to-be-simulated processors, so as to control the scheduler to synchronously invoke, by using the master thread and the at least one slave thread, the corresponding to-be-simulated processors, thereby ensuring consistency of scheduling of the to-be-simulated processors. The first cycle interface registers with the scheduler through the determined corresponding to-be-simulated processors.

Optionally, the scheduler, which is the executive body of 101 to 103, may be a scheduling unit in a SIMICS simulator. Accordingly, the scheduler may assign an address of a debug interface of the to-be-simulated processor requiring debugging to a debug interface pointer of the scheduler, which specifically may include, but is not limited to, at least one of the following situations:

assigning, by the scheduler, an address of a single-step interface (single-step interface) of the to-be-simulated processor requiring debugging to a single-step interface pointer of the scheduler;

assigning, by the scheduler, an address of a breakpoint query interface (breakpoint query interface) of the to-be-simulated processor requiring debugging to a breakpoint query interface pointer of the scheduler; and assigning, by the scheduler, an address of a breakpoint trigger interface (breakpoint trigger interface) of the to-be-simulated processor requiring debugging to a breakpoint trigger interface pointer of the scheduler.

Optionally, in order to notify a breakpoint update operation set by an operator to the to-be-simulated processor requiring debugging, the scheduler may further assign an address of a breakpoint control interface (breakpoint control interface) of the to-be-simulated processor requiring debugging to a breakpoint control interface pointer of the scheduler, so that the scheduler invokes, by using the breakpoint control interface pointer, the to-be-simulated processor requiring debugging, so as to notify the breakpoint update operation, such as setting a breakpoint and canceling a breakpoint.

Optionally, in order to obtain breakpoint information, the scheduler may further assign an address of a breakpoint query interface (breakpoint query interface) of the scheduler to a breakpoint query interface pointer of the to-be-simulated processor requiring debugging, so that the to-be-simulated processor requiring debugging invokes the scheduler by using the breakpoint query interface pointer to obtain the breakpoint information, such as an initial address of the breakpoint, a termination address of the breakpoint, and a trigger property of the breakpoint.

Accordingly, in order to trigger the scheduler to stop invoking the to-be-simulated processor requiring debugging, the scheduler may further assign an address of a breakpoint trigger interface (breakpoint trigger interface) of the scheduler to a breakpoint trigger interface pointer of the to-be-simulated processor requiring debugging, so that the to-be-simulated processor requiring debugging invokes the scheduler by using the breakpoint trigger interface pointer, so as to trigger the scheduler to stop invoking the to-be-simulated processor requiring debugging. For example, after obtaining the breakpoint information, in each running cycle, the to-be-simulated processor requiring debugging may further check whether current running status satisfies a condition corresponding to the breakpoint information. If not, the to-be-simulated processor requiring debugging continues to run a next cycle; if yes, the to-be-simulated processor requiring debugging invokes the scheduler by using the breakpoint trigger interface pointer.

Optionally, the scheduler, which is the executive body of 101 to 103, may be an independently set controller unit. Accordingly, the scheduler may assign an address of a debug interface of the to-be-simulated processor requiring debugging to a debug interface pointer of the scheduler, and assign the debug interface pointer of the scheduler to a debug interface pointer of the SIMICS simulator, which may specifically include, but is not limited to, at least one of the following situations:

assigning, by the scheduler, an address of a single-step interface of the to-be-simulated processor requiring debugging to a single-step interface pointer of the scheduler, and assigning the single-step interface pointer of the scheduler to a single-step interface pointer of the SIMICS simulator;

assigning, by the scheduler, an address of a status query interface of the to-be-simulated processor requiring debugging to a status query interface pointer of the scheduler, and assigning the status query interface pointer of the scheduler to a status query interface pointer of the SIMICS simulator; and assigning, by the scheduler, an address of a status setting interface of the to-be-simulated processor requiring debugging to a status setting interface pointer of the scheduler, and assigning the status setting interface pointer of the scheduler to a status setting interface pointer of the SIMICS simulator.

Optionally, in order to notify a breakpoint update operation set by an operator to the to-be-simulated processor requiring debugging, the scheduler may further assign an address of a breakpoint control interface of the to-be-simulated processor requiring debugging to a breakpoint control interface pointer of the scheduler, and assign the breakpoint control interface pointer of the scheduler to a breakpoint control interface pointer of the SIMICS simulator, so that the SIMICS simulator invokes, by using the breakpoint control interface pointer, the to-be-simulated processor requiring debugging, so as to notify the breakpoint update operation, such as setting a breakpoint and canceling a breakpoint.

Optionally, in order to obtain breakpoint information, the scheduler may further assign an address of a breakpoint query interface of the SIMICS simulator to a breakpoint query interface pointer of the scheduler, so that the scheduler invokes the SIMICS simulator by using the breakpoint query interface pointer, so as to obtain the breakpoint information, such as an initial address of the breakpoint, a termination address of the breakpoint, and a trigger property of the breakpoint.

Accordingly, in order to trigger the scheduler to stop invoking the to-be-simulated processor requiring debugging, the scheduler may further assign an address of a breakpoint trigger interface of the SIMICS simulator to a breakpoint trigger interface pointer of the scheduler, so that the scheduler invokes the SIMICS simulator by using the breakpoint trigger interface pointer, so as to trigger the scheduler to stop invoking the to-be-simulated processor requiring debugging. For example, after obtaining the breakpoint information, in each running cycle, the scheduler may further check whether current running status of the to-be-simulated processor requiring debugging satisfies a condition corresponding to the breakpoint information. If not, the to-be-simulated processor requiring debugging continues to run a next cycle; if yes, the scheduler invokes the SIMICS simulator by using the breakpoint trigger interface pointer.

Optionally, in order to obtain the breakpoint information, the scheduler may further assign an address of a breakpoint query interface of the SIMICS simulator to the breakpoint query interface pointer of the scheduler, and assign the breakpoint query interface pointer of the scheduler to a breakpoint query interface pointer of the to-be-simulated processor requiring debugging, so that the to-be-simulated processor requiring debugging invokes the SIMICS simulator by using the breakpoint query interface pointer, so as to obtain the breakpoint information, such as an initial address of the breakpoint, a termination address of the breakpoint, and a trigger property of the breakpoint.

Accordingly, in order to trigger the scheduler to stop invoking the to-be-simulated processor requiring debugging, the scheduler may further assign an address of a breakpoint trigger interface of the SIMICS simulator to the breakpoint trigger interface pointer of the scheduler, and assign the breakpoint trigger interface pointer of the scheduler to a breakpoint trigger interface pointer of the to-be-simulated processor requiring debugging, so that the to-be-simulated processor requiring debugging invokes the SIMICS simulator by using the breakpoint trigger interface pointer, so as to trigger the SIMICS simulator to stop invoking the to-be-simulated processor requiring debugging. For example, after obtaining the breakpoint information, in each running cycle, the to-be-simulated processor requiring debugging may further check whether current running status satisfies a condition corresponding to the breakpoint information. If not, the to-be-simulated processor requiring debugging continues to run a next cycle; if yes, the to-be-simulated processor requiring debugging invokes the SIMICS simulator by using the breakpoint trigger interface pointer.

Further, the scheduler may further register a corresponding second execute interface with a scheduling unit in the SIMICS simulator, so that the scheduling unit schedules the scheduler via the second execute interface to create at least one slave thread by using the master thread. Accordingly, the scheduler may further register a corresponding second cycle interface with the scheduling unit in the SIMICS simulator, so that the scheduling unit delivers a cycle parameter to the scheduler by using the master thread via the second cycle interface, and the scheduler delivers, by using the master thread and the at least one slave thread via the first cycle interface, the cycle parameter to the determined corresponding to-be-simulated processors, so as to control the scheduler to synchronously invoke, by using the master thread and the at least one slave thread, the corresponding to-be-simulated processors, where the first cycle interface registers with the scheduler through the determined corresponding to-be-simulated processors.

In this embodiment, a scheduler creates at least one slave thread by using a master thread, and determines to-be-simulated processors corresponding to the master thread and the at least one slave thread, so that the scheduler is capable of invoking, by using the master thread and the at least one slave thread via a first execute interface that is registered with the scheduler through the determined corresponding to-be-simulated processors, the determined corresponding to-be-simulated processors to execute a corresponding instruction. The to-be-simulated processors can be scheduled by using the master thread and the at least one slave thread at a time, so parallel simulation of multiple processors can be implemented, which avoids the problem in the prior art that parallel simulation of multiple processors cannot be implemented because one to-be-simulated processor is scheduled at a time, thereby improving the simulation efficiency. Meanwhile, processor resources of a host machine where the scheduler is located can be fully used, thereby improving resource utilization efficiency. In addition, the scheduler maps debug interface information of a to-be-simulated processor requiring debugging onto the scheduler, so that the scheduler is capable of debugging the to-be-simulated processor requiring debugging by using the master thread via a debug interface of the to-be-simulated processor requiring debugging pointed by the debug interface information, thereby implementing debugging during parallel simulation of multiple processors.

Figure 2:
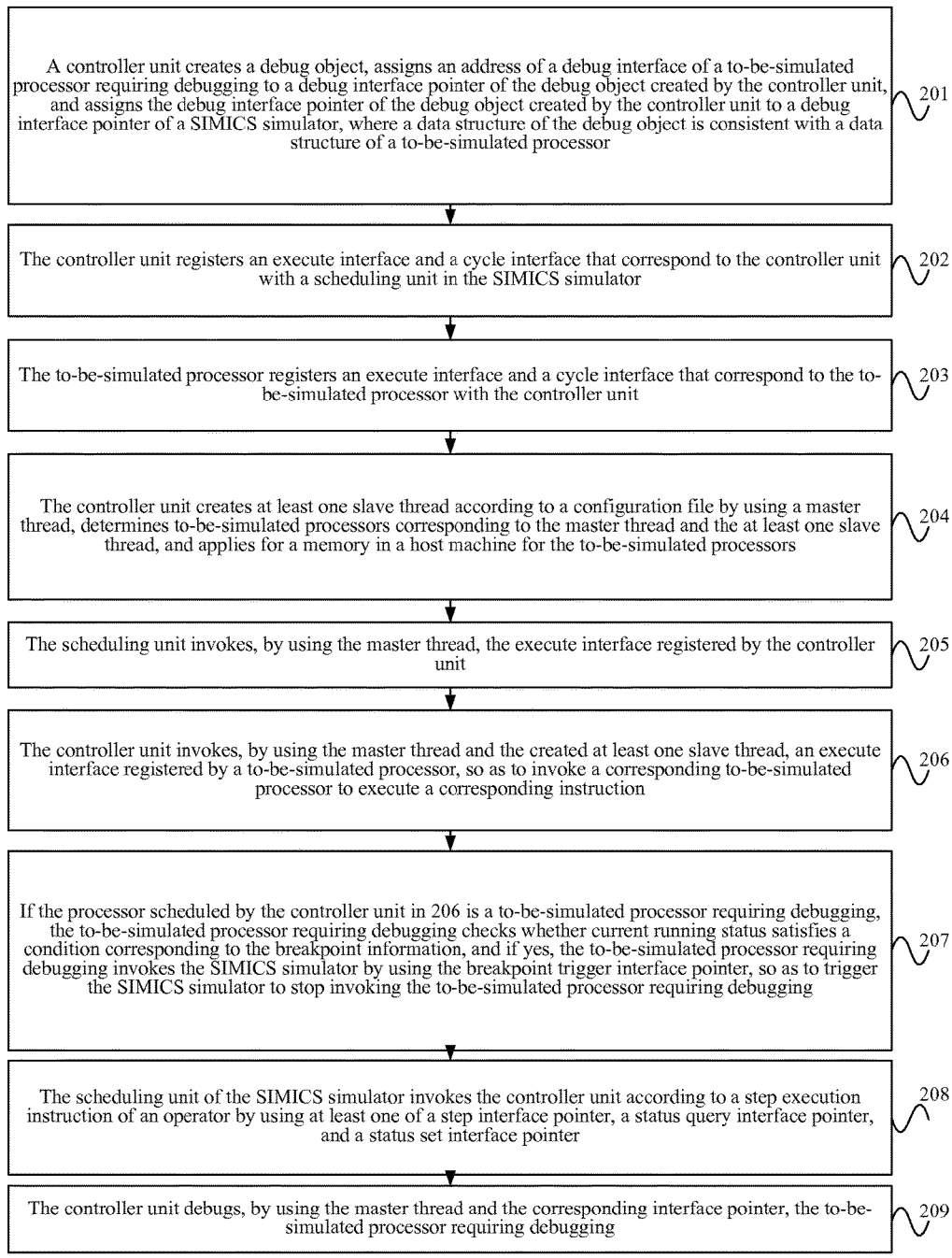
FIG. 2 is a schematic flow chart of a method for simulating multiple processors in parallel according to another embodiment of the present invention.
Figure 3:
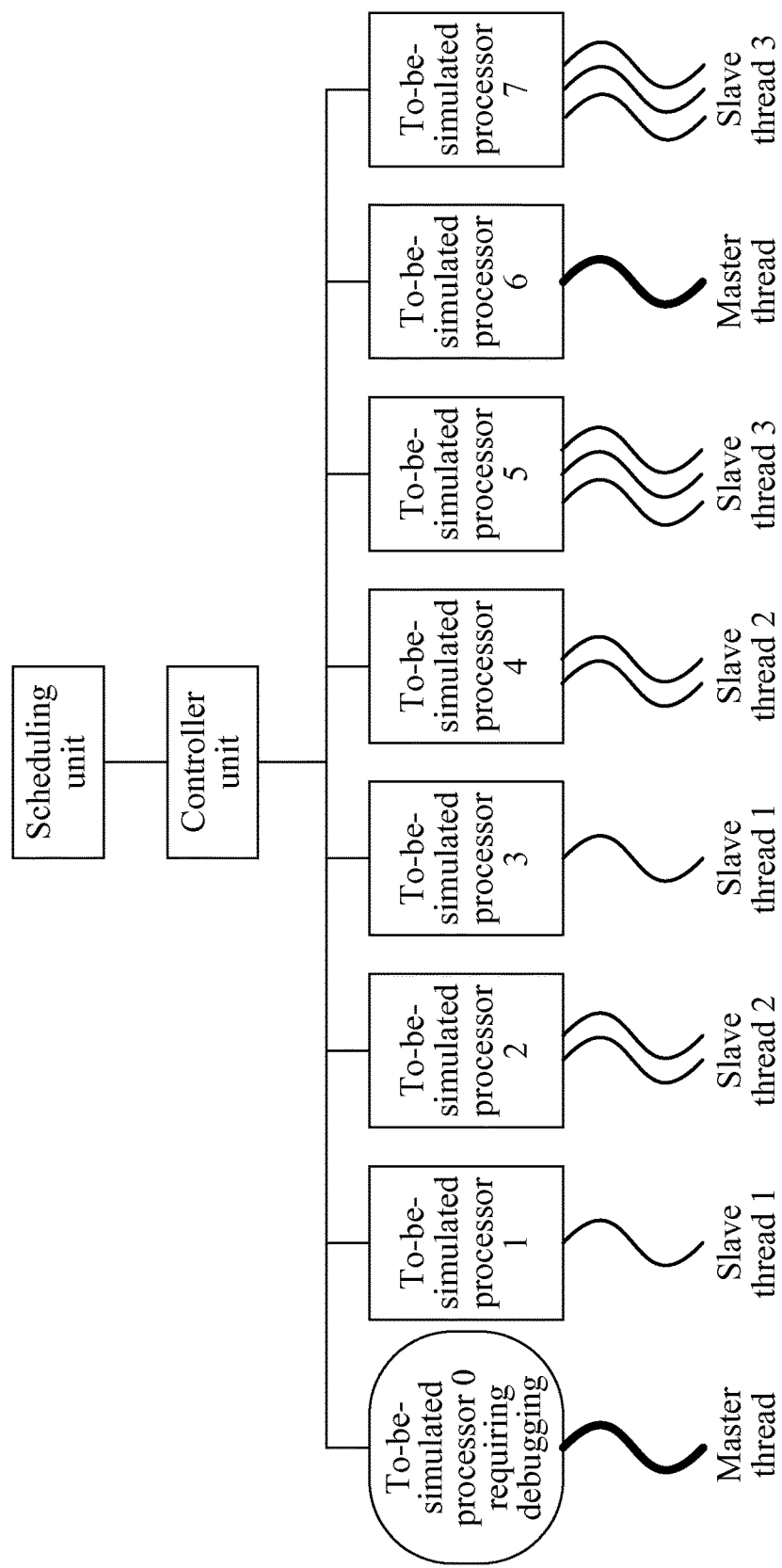
FIG. 3 is a schematic diagram of system architecture to which the embodiment corresponding to FIG. 2 is applicable.

In order to make the method according to the embodiment of the present invention clearer, the following takes the scheduler, which is the executive body of 101 to 103, being an independently set controller (Controller) unit as an example. FIG. 2 is a schematic flow chart of a method for simulating multiple processors in parallel according to another embodiment of the present invention, and system architecture to which this embodiment is applicable may be shown in FIG. 3. As shown in FIG. 2, the method for simulating multiple processors in parallel in this embodiment may include:

201: A controller unit creates a debug object, assigns an address of a debug interface of a to-be-simulated processor requiring debugging to a debug interface pointer of the debug object created by the controller unit, and assigns the debug interface pointer of the debug object created by the controller unit to a debug interface pointer of a SIMICS simulator, where a data structure of the debug object is consistent with a data structure of a to-be-simulated processor.

The debug interface may include, but is not limited to, at least one of a single-step interface, a status query interface and a status setting interface.

Optionally, the controller unit may further assign an address of a breakpoint control interface of the to-be-simulated processor requiring debugging to a breakpoint control interface pointer of the scheduler, and assign the breakpoint control interface pointer of the scheduler to a breakpoint control interface pointer of the SIMICS simulator, so that the SIMICS simulator invokes, by using the breakpoint control interface pointer, the to-be-simulated processor requiring debugging, so as to notify a breakpoint update operation, such as setting a breakpoint and canceling a breakpoint.

Optionally, the controller unit may further assign an address of a breakpoint query interface of the SIMICS simulator to a breakpoint query interface pointer of the controller unit, and assign the breakpoint query interface pointer of the controller unit to a breakpoint query interface pointer of the to-be-simulated processor requiring debugging, so that the to-be-simulated processor requiring debugging invokes the SIMICS simulator by using the breakpoint query interface pointer, so as to obtain breakpoint information, such as an initial address of the breakpoint, a termination address of the breakpoint and a trigger property of the breakpoint.

Accordingly, the controller unit may further assign an address of a breakpoint trigger interface of the SIMICS simulator to a breakpoint trigger interface pointer of the controller unit, and assign the breakpoint trigger interface pointer of the controller unit to a breakpoint trigger interface pointer of the to-be-simulated processor requiring debugging, so that the to-be-simulated processor requiring debugging invokes the SIMICS simulator by using the breakpoint trigger interface pointer, so as to trigger the SIMICS simulator to stop invoking the to-be-simulated processor requiring debugging. For example, after obtaining the breakpoint information, in each running cycle, the to-be-simulated processor requiring debugging may further check whether current running status satisfies a condition corresponding to the breakpoint information. If not, the to-be-simulated processor requiring debugging continues to run a next cycle; if yes, the to-be-simulated processor requiring debugging invokes the SIMICS simulator by using the breakpoint trigger interface pointer.

202: The controller unit registers an execute interface and a cycle interface that correspond to the controller unit with a scheduling unit in the SIMICS simulator.

203: The to-be-simulated processor registers an execute interface and a cycle interface that correspond to the to-be-simulated processor with the controller unit.

204: The controller unit creates at least one slave thread according to a configuration file by using a master thread, determines to-be-simulated processors corresponding to the master thread and the at least one slave thread, and applies for a memory in a host machine for the to-be-simulated processors.

For example, the master thread corresponds to to-be-simulated processor 0 and to-be-simulated processor 6, where to-be-simulated processor 0 is a to-be-simulated processor requiring debugging, that is, can be marked as to-be-simulated processor 0 requiring debugging;

slave thread 1 corresponds to to-be-simulated processor 1 and to-be-simulated processor 3;

slave thread 2 corresponds to to-be-simulated processor 2 and to-be-simulated processor 4; and slave thread 3 corresponds to to-be-simulated processor 5 and to-be-simulated processor 7.

Optionally, the controller unit may apply for the same memory in the host machine for the to-be-simulated processors, so as to implement simulation of multiple to-be-simulated processors all accessing the same memory, or the controller unit may apply for different memories in the host machine for the to-be-simulated processors, so as to implement simulation of multiple to-be-simulated processors accessing different memories.

205: The scheduling unit invokes, by using the master thread, the execute interface registered by the controller unit.

206: The controller unit invokes, by using the master thread and the created at least one slave thread, an execute interface registered by a to-be-simulated processor, so as to invoke a corresponding to-be-simulated processor to execute a corresponding instruction.

For example, the controller unit invokes, by using the master thread, the execute interface registered by to-be-simulated processor 0 requiring debugging, and then invokes the execute interface registered by to-be-simulated processor 6;

the controller unit invokes, by using slave thread 1, the execute interface registered by to-be-simulated processor 1, and then invokes the execute interface registered by to-be-simulated processor 3;

the controller unit invokes, by using slave thread 2, the execute interface registered by to-be-simulated processor 2, and then invokes the execute interface registered by to-be-simulated processor 4; and the controller unit invokes, by using slave thread 3, the execute interface registered by to-be-simulated processor 5, and then invokes the execute interface registered by to-be-simulated processor 7.

207: If the processor invoked by the controller unit in 206 is a to-be-simulated processor requiring debugging, the to-be-simulated processor requiring debugging checks whether current running status satisfies a condition corresponding to the breakpoint information. If not, the to-be-simulated processor requiring debugging continues to run a next cycle; if yes, the to-be-simulated processor requiring debugging invokes the SIMICS simulator by using the breakpoint trigger interface pointer, so as to trigger the SIMICS simulator to stop invoking the to-be-simulated processor requiring debugging.

If the processor invoked by the controller unit in 206 is not a to-be-simulated processor requiring debugging, the process ends.

208: The scheduling unit of the SIMICS simulator invokes the controller unit according to a step execution instruction of an operator by using at least one of a single-step interface pointer, a status query interface pointer, and a status set interface pointer.

209: The controller unit debugs, by using the master thread and the corresponding interface pointer, the to-be-simulated processor requiring debugging.

For example, after the operator sets the breakpoint by using the scheduling unit of the SIMICS simulator, the SIMICS simulator may invoke, by using the breakpoint control interface pointer, the to-be-simulated processor requiring debugging, so as to notify a breakpoint setting operation. Accordingly, the to-be-simulated processor requiring debugging invokes the SIMICS simulator by using the breakpoint query interface pointer, so as to obtain the breakpoint information, such as an initial address of the breakpoint, a termination address of the breakpoint, and a trigger property of the breakpoint. After obtaining the breakpoint information, in each running cycle, the to-be-simulated processor requiring debugging checks whether current running status satisfies a condition corresponding to the breakpoint information. If not, the to-be-simulated processor requiring debugging continues to run a next cycle; if yes, the to-be-simulated processor requiring debugging invokes the SIMICS simulator by using the breakpoint trigger interface pointer, so as to trigger the SIMICS simulator to stop invoking the to-be-simulated processor requiring debugging. Then the scheduling unit of the SIMICS simulator debugs, according to a step execution instruction of the operator by using at least one of a single-step interface pointer, a status query interface pointer, and a status set interface pointer, the to-be-simulated processor requiring debugging.

Optionally, in 205, the scheduling unit may further invoke, by using the master thread, the cycle interface registered by the controller unit, so as to deliver a cycle parameter (such as a processor switch time (CPU-switch-time) parameter, used for indicating the specified number of the executed instructions) to the controller unit, so that the controller unit further invokes, by using the master thread and the created at least one slave thread, the cycle interface registered by the to-be-simulated processor, so as to deliver a target time of switching to the to-be-simulated processor, where the target time of switching is used to control the master thread and the at least one slave thread to invoke synchronization of the corresponding to-be-simulated processors. For example, a to-be-simulated processor on a slave thread notifies the controller unit on the master thread after executing a specified number of instructions, and enters into the dormant state; the controller unit on the master thread exits the execute interface after receiving notifications of all to-be-simulated processors on the slave thread, and waits to re-execute 205.

In this embodiment, after being invoked by a scheduling unit in a SIMICS simulator, a controller unit creates at least one slave thread by using a master thread, and determines to-be-simulated processors corresponding to the master thread and the at least one slave thread, so that the controller unit is capable of invoking, by using the master thread and the at least one slave thread via a first execute interface that is registered with the controller unit by the to-be-simulated processors, the determined corresponding to-be-simulated processors to execute a corresponding instruction. The to-be-simulated processors can be scheduled by using the master thread and the at least one slave thread at a time, so parallel simulation of multiple processors can be implemented, which avoids the problem in the prior art that parallel simulation of multiple processors cannot be implemented because one to-be-simulated processor is scheduled at a time, thereby improving the simulation efficiency. Meanwhile, processor resources of a host machine where the scheduler is located can be fully used, thereby improving resource utilization efficiency. In addition, the controller unit maps debug interface information of a to-be-simulated processor requiring debugging onto a debug object created by the controller unit, so that the controller unit is capable of debugging the to-be-simulated processor requiring debugging by using the master thread via a debug interface of the to-be-simulated processor requiring debugging pointed by the debug interface information, thereby implementing debugging during parallel simulation of multiple processors.

It should be noted that, for ease of description, the aforementioned method embodiments are described as a series of action combination. However, persons skilled in the art should know that the present invention is not limited to any described sequence of actions, because some steps can adopt other sequences or can be performed simultaneously according to the present invention. Secondarily, persons skilled in the art should know that the embodiments described in the specification all belong to exemplary embodiments and the involved actions and modules are not mandatory for the present invention.

In the foregoing embodiments, description of each embodiment has its emphasis. For the part not described in detail in a certain embodiment, reference may be made to related description in other embodiments.

Figure 4:
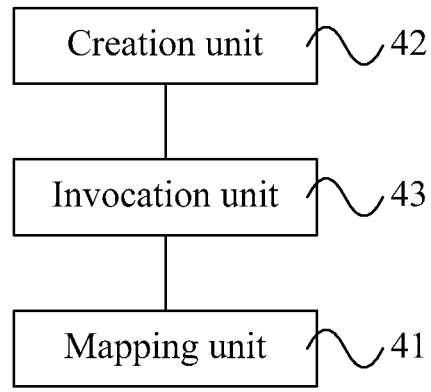
FIG. 4 is a schematic structural diagram of a scheduler according to another embodiment of the present invention.

FIG. 4 is a schematic structural diagram of a scheduler according to another embodiment of the present invention. As shown in FIG. 4, the scheduler in this embodiment may include a mapping unit 41, a creation unit 42, and an invocation unit 43. The mapping unit 41 is configured to map debug interface information of a to-be-simulated processor requiring debugging onto the scheduler; the creation unit 42 is configured to create at least one slave thread by using a master thread, and determine to-be-simulated processors corresponding to the master thread and the at least one slave thread, so as to obtain the determined corresponding to-be-simulated processors, where the to-be-simulated processor corresponding to the master thread includes the to-be-simulated processor requiring debugging; and the invocation unit 43 is configured to invoke, via a first execute interface by using the master thread and the at least one slave thread created by the creation unit, the corresponding to-be-simulated processors determined by the creation unit to execute a corresponding instruction, and debug, by using the master thread via a debug interface of the to-be-simulated processor requiring debugging, the to-be-simulated processor requiring debugging.

The first execute interface registers with the scheduler through the determined corresponding to-be-simulated processors; and the debug interface information mapped by the mapping unit points to the debug interface.

The function of the scheduler in the embodiment corresponding to FIG. 1 may be implemented by the scheduler according to this embodiment.

Optionally, the invocation unit 43 in this embodiment invokes the corresponding to-be-simulated processors determined by the creation unit to execute a corresponding instruction, where the corresponding instruction may include, but is not limited to, at least one of the following instructions: an instruction of accessing a memory, including an instruction used for accessing the same memory or different memories; and an instruction of accessing a peripheral, including an instruction used for accessing the same peripheral or different peripherals.

Optionally, the invocation unit 43 in this embodiment invokes the corresponding to-be-simulated processors determined by the creation unit to execute a corresponding instruction, where the instruction may also be an atomic instruction, then the invocation unit 43 may specifically invoke, by using a mutex locking operation, the corresponding to-be-simulated processors determined by the creation unit to execute a corresponding instruction.

Optionally, the invocation unit 43 may further deliver, by using the master thread and the at least one slave thread via a first cycle interface (cycle interface), a cycle parameter to the determined corresponding to-be-simulated processors, so as to control the scheduler to synchronously invoke, by using the master thread and the at least one slave thread, the corresponding to-be-simulated processors, thereby ensuring consistency of scheduling of the to-be-simulated processors. The first cycle interface registers with the scheduler through the determined corresponding to-be-simulated processors.

Optionally, the scheduler in this embodiment may be a scheduling unit in a SIMICS simulator. Accordingly, the mapping unit 41 in this embodiment may specifically assign an address of a debug interface of the to-be-simulated processor requiring debugging to a debug interface pointer of the scheduler, For example, as shown in FIG. 5, the mapping unit 41 may include, but is not limited to, at least one of the following subunits:

a first mapping subunit 51, configured to assign an address of a single-step interface of the to-be-simulated processor requiring debugging to a single-step interface pointer of the scheduler;

a second mapping subunit 52, configured to assign an address of a status query interface of the to-be-simulated processor requiring debugging to a status query interface pointer of the scheduler; and a third mapping subunit 53, configured to assign an address of a status setting interface of the to-be-simulated processor requiring debugging to a status setting interface pointer of the scheduler.

Figure 5:
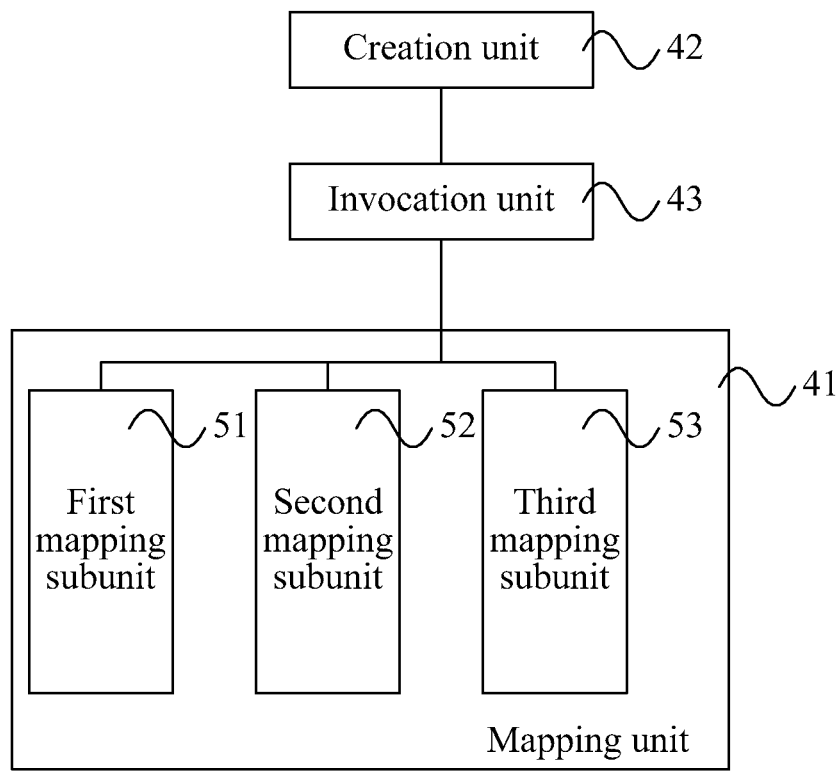
FIG. 5 is a schematic structural diagram of a scheduler according to another embodiment of the present invention.

It should be pointed out that, FIG. 5 only shows a scenario where the first mapping subunit 51, the second mapping subunit 52, and the third mapping subunit 53 are included simultaneously. In an optional embodiment, any one or two of the three subunits may be included.

Figure 6:
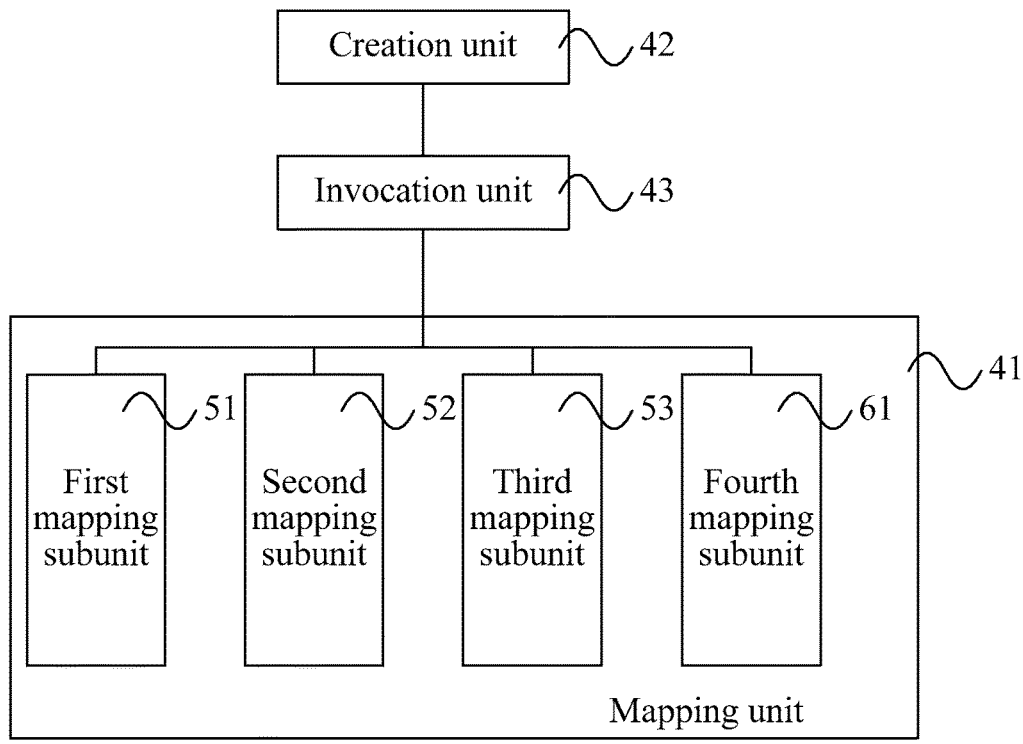
FIG. 6 is a schematic structural diagram of a scheduler according to another embodiment of the present invention.

Optionally, as shown in FIG. 6, the mapping unit 41 in this embodiment may further include a fourth mapping subunit 61, configured to assign an address of a breakpoint control interface of the to-be-simulated processor requiring debugging to a breakpoint control interface pointer of the scheduler.

Optionally, the mapping unit 41 in this embodiment may further be configured to assign an address of a breakpoint query interface of the scheduler to a breakpoint query interface pointer of the to-be-simulated processor requiring debugging; and assign an address of a breakpoint trigger interface of the scheduler to a breakpoint trigger interface pointer of the to-be-simulated processor requiring debugging.

Optionally, the scheduler in this embodiment may also be an independently set controller unit. Accordingly, the mapping unit 41 in this embodiment may specifically assign an address of a debug interface of the to-be-simulated processor requiring debugging to a debug interface pointer of the scheduler, and assign the debug interface pointer of the scheduler to a debug interface pointer of the SIMICS simulator, For example, as shown in FIG. 7, the mapping unit 41 may include, but is not limited to, at least one of the following subunits:

a fifth mapping subunit 71, configured to assign an address of a single-step interface of the to-be-simulated processor requiring debugging to a single-step interface pointer of the scheduler, and assign the single-step interface pointer of the scheduler to a single-step interface pointer of the SIMICS simulator;

a sixth mapping subunit 72, configured to assign an address of a status query interface of the to-be-simulated processor requiring debugging to a status query interface pointer of the scheduler, and assign the status query interface pointer of the scheduler to a status query interface pointer of the SIMICS simulator; and a seventh mapping subunit 73, configured to assign an address of a status setting interface of the to-be-simulated processor requiring debugging to a status setting interface pointer of the scheduler, and assign the status setting interface pointer of the scheduler to a status setting interface pointer of the SIMICS simulator.

Figure 7:
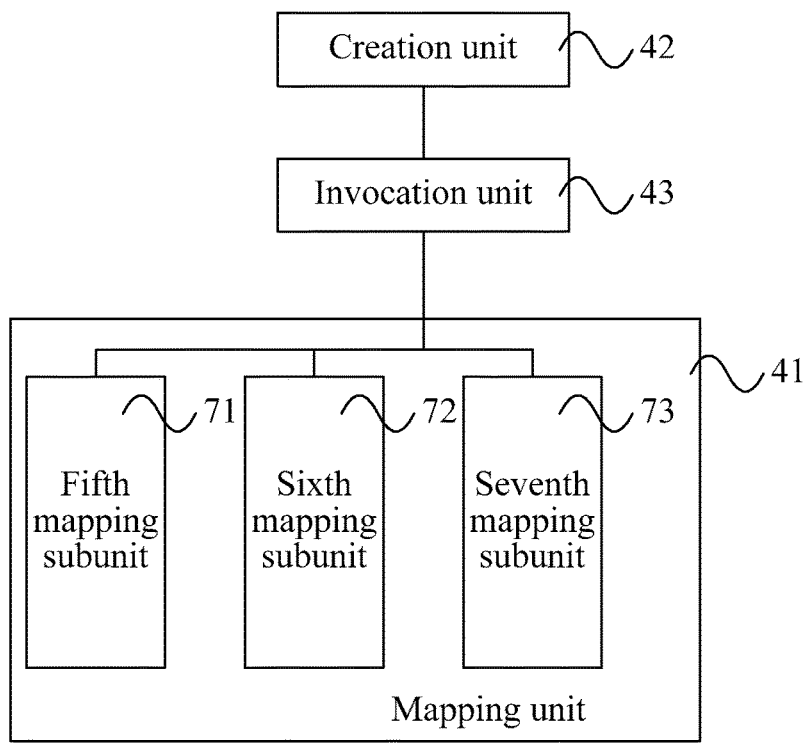
FIG. 7 is a schematic structural diagram of a system for simulating multiple processors in parallel according to another embodiment of the present invention.

It should be pointed out that, FIG. 7 only shows a scenario where the fifth mapping subunit 71, the sixth mapping subunit 72, and the seventh mapping subunit 73 are included simultaneously. In an optional embodiment, any one or two of the three subunits may be included.

Figure 8:
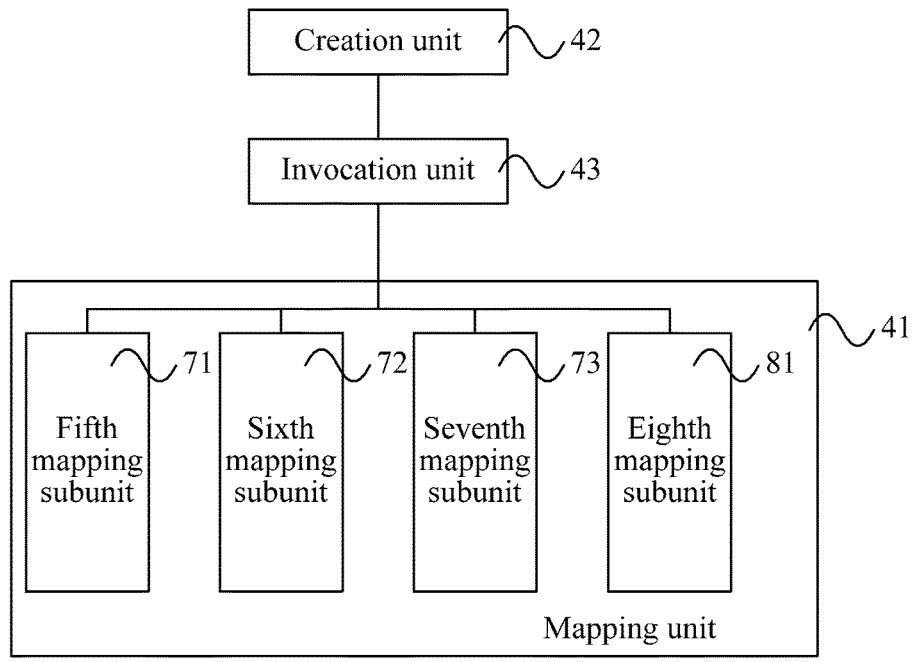
FIG. 8 is a schematic structural diagram of a system for simulating multiple processors in parallel according to another embodiment of the present invention.

Optionally, as shown in FIG. 8, the mapping unit 41 in this embodiment may further include an eighth mapping subunit 81, configured to assign an address of a breakpoint control interface of the to-be-simulated processor requiring debugging to a breakpoint control interface pointer of the scheduler, and assign the breakpoint control interface pointer of the scheduler to a breakpoint control interface pointer of the SIMICS simulator.

Optionally, the mapping unit 41 in this embodiment may further assign an address of a breakpoint query interface of the SIMICS simulator to a breakpoint query interface pointer of the scheduler; and assign an address of a breakpoint trigger interface of the SIMICS simulator to a breakpoint trigger interface pointer of the scheduler, so that the scheduler checks whether current running status of the to-be-simulated processor requiring debugging satisfies a condition corresponding to breakpoint information.

Optionally, the mapping unit 41 in this embodiment may further assign the breakpoint query interface pointer of the scheduler to a breakpoint query interface pointer of the to-be-simulated processor requiring debugging; and assign the breakpoint trigger interface pointer of the scheduler to a breakpoint trigger interface pointer of the to-be-simulated processor requiring debugging, so that the to-be-simulated processor requiring debugging checks whether the running status thereof satisfies the condition corresponding to the breakpoint information.

Figure 9:
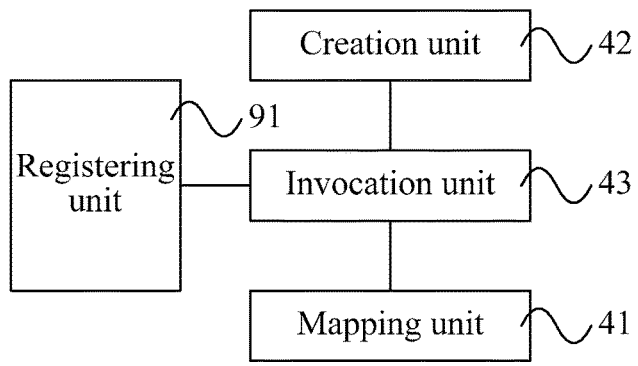
FIG. 9 is a schematic structural diagram of a system for simulating multiple processors in parallel according to another embodiment of the present invention.

Further, as shown in FIG. 9, the scheduler in this embodiment may further include a registering unit 91, configured to register a corresponding second execute interface with the scheduling unit in the SIMICS simulator, so that the scheduling unit schedules the scheduler via the second execute interface to create at least one slave thread by using the master thread.

Accordingly, the registering unit 91 may further register a corresponding second cycle interface with the scheduling unit in the SIMICS simulator, so that the scheduling unit delivers a cycle parameter to the scheduler by using the master thread via the second cycle interface, and the invocation unit delivers, by using the master thread and the at least one slave thread via the first cycle interface, the cycle parameter to the determined corresponding to-be-simulated processors, so as to control the invocation unit to synchronously invoke, by using the master thread and the at least one slave thread, the corresponding to-be-simulated processors. The first cycle interface registers with the scheduler through the determined corresponding to-be-simulated processors.

In this embodiment, in the scheduler, the creation unit creates at least one slave thread by using a master thread through and determines to-be-simulated processors corresponding to the master thread and the at least one slave thread, so that the invocation unit is capable of invoking, by using the master thread and the at least one slave thread via a first execute interface that is registered with the scheduler through the corresponding to-be-simulated processors determined by the creation unit, the corresponding to-be-simulated processors determined by the creation unit to execute a corresponding instruction. The to-be-simulated processors can be scheduled by using the master thread and the at least one slave thread at a time, so parallel simulation of multiple processors can be implemented, which avoids the problem in the prior art that parallel simulation of multiple processors cannot be implemented because one to-be-simulated processor is scheduled at a time, thereby improving the simulation efficiency. Meanwhile, processor resources of a host machine where the scheduler is located can be fully used, thereby improving resource utilization efficiency. In addition, the mapping unit maps debug interface information of a to-be-simulated processor requiring debugging onto a debug object created by the controller unit, so that the invocation unit is capable of debugging the to-be-simulated processor requiring debugging by using the master thread via a debug interface of the to-be-simulated processor requiring debugging pointed by the debug interface information, thereby implementing debugging during parallel simulation of multiple processors.

Figure 10:
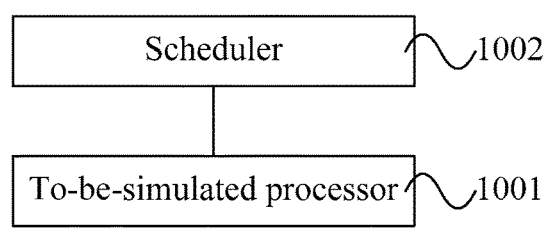
FIG. 10 is a schematic structural diagram of a system for simulating multiple processors in parallel according to another embodiment of the present invention.

FIG. 10 is a schematic structural diagram of a system for simulating multiple processors in parallel according to another embodiment of the present invention. As shown in FIG. 10, the system for simulating multiple processors in parallel in this embodiment may include a to-be-simulated processor 1001 and a scheduler 1002. The scheduler may be the scheduler according to any one of the embodiments corresponding to FIG. 4, FIG. 5, FIG. 6, FIG. 7, FIG. 8, and FIG. 9. For detailed description, reference may be made to related content in the corresponding embodiment, which will not be described herein again.

In this embodiment, the scheduler creates at least one slave thread by using a master thread, and determines to-be-simulated processors corresponding to the master thread and the at least one slave thread, so that the scheduler is capable of invoking, by using the master thread and the at least one slave thread via a first execute interface that is registered with the scheduler through the corresponding to-be-simulated processors determined by the scheduler, the corresponding to-be-simulated processors determined by the scheduler to execute a corresponding instruction. The to-be-simulated processors can be scheduled by using the master thread and the at least one slave thread at a time, so parallel simulation of multiple processors can be implemented, which avoids the problem in the prior art that parallel simulation of multiple processors cannot be implemented because one to-be-simulated processor is scheduled at a time, thereby improving the simulation efficiency. Meanwhile, processor resources of a host machine where the scheduler is located can be fully used, thereby improving resource utilization efficiency. In addition, the scheduler maps debug interface information of a to-be-simulated processor requiring debugging onto the scheduler, so that the scheduler is capable of debugging, by using the master thread via a debug interface of the to-be-simulated processor requiring debugging pointed by the debug interface information, the to-be-simulated processor requiring debugging, thereby implementing debugging during parallel simulation of multiple processors.

It can be clearly understood by persons skilled in the art that, for the purpose of convenient and brief description, for a detailed working process of the foregoing system, apparatus and unit, reference may be made to the corresponding process in the method embodiments, which will not be described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical or other forms.

The units described as separate parts may or may not be physically separate, and parts displayed as units may or may not be physical units, may be located in one position, or may be distributed on multiple network units. A part or all of the units may be selected according to an actual need to achieve the objectives of the solutions of the embodiments.

In addition, functional units in the embodiments of the present invention may be integrated into one processing unit, or each of the units may exist alone physically, or two or more units are integrated into one unit. The integrated unit may be implemented in a form of hardware, or may be implemented in a form of hardware plus a software functional unit.

The integrated module implemented in a form of software functional module may be stored in a computer readable storage medium. The software functional module is stored in a storage medium, including a plurality of instructions to enable a computer device (which may be a personal computer, a server or a network device and the like) to perform part of steps described in each embodiment of the present application. The storage medium includes: any medium that can store program codes, such as a USB flash disk, a removable hard disk, a read-only memory (Read-Only Memory, ROM for short), a random access memory (Random Access Memory, RAM for short), a magnetic disk, or an optical disk.

Finally, it should be noted that the foregoing embodiments are merely intended for describing the technical solutions of the present invention other than limiting the present invention. Although the present invention is described in detail with reference to the foregoing embodiments, a person of ordinary skill in the art should understand that they may still make modifications to the technical solution described in the foregoing embodiments or make equivalent replacements to some technical features thereof; without departing from the scope of the technical solution of the embodiments of the present invention.

What is claimed is:

1. A method for simulating multiple processors in parallel, the method comprising:
    mapping, by a scheduler, debug interface information of at least one processor requiring debugging onto the scheduler by assigning an address of a debug interface of the processor requiring debugging to an interface pointer of the scheduler,
        wherein the interface is one of a (a) single-step interface, (b) status query interface and (c) status setting interface and the interface pointer is one of a (a) single-step interface pointer, (b) a status query interface pointer and (c) status setting interface pointer;
    creating, by the scheduler, at least one slave thread according to a configuration file by using a master thread, and determining at least one first processor corresponding to the master thread and at least one second processor corresponding to the at least one slave thread, wherein the at least one first processor corresponding to the master thread comprise the at least one processor requiring debugging,
        wherein a maximum number of the at least one slave thread is equal to a result obtained by subtracting 1 from a number of processors of a host machine where the scheduler is located, and each slave thread corresponds to one processor of the host machine, and
        wherein the configuration file comprises a number of the at least one slave thread, number information of the at least one processor requiring debugging and a mapping relationship between the at least one slave thread and the at least one second processor;
    invoking, by the scheduler, by using the master thread and the at least one slave thread via a first execute interface, the at least one first and second processors to execute a corresponding instruction;
    debugging the processor requiring debugging by using the master thread via the debug interface of the processor requiring debugging, wherein the first execute interface registers with the scheduler through the at least one first and second processors; and
    delivering, by the scheduler, by using the master thread and the at least one slave thread via a first cycle interface, a cycle parameter to the at least one first and second processors, so as to control the scheduler to synchronously invoke, by using the master thread and the at least one slave thread, the at least one first and second processors, wherein the first cycle interface registers with the scheduler through the at least one first and second processors.

2. The method according to claim 1, wherein the mapping, by the scheduler, the debug interface information of the at least one processor requiring the debugging onto the scheduler further comprises: assigning, by the scheduler, an address of a breakpoint control interface of the at least one processor requiring debugging to a breakpoint control interface pointer of the scheduler.

3. The method according to claim 2, further comprising:
    assigning, by the scheduler, an address of a breakpoint query interface of the scheduler to a breakpoint query interface pointer of the at least one processor requiring debugging; and
    assigning, by the scheduler, an address of a breakpoint trigger interface of the scheduler to a breakpoint trigger interface pointer of the at least one processor requiring debugging.

4. The method according to claim 1, wherein the mapping, by the scheduler, the debug interface information of the at least one processor requiring the debugging onto the scheduler comprises at least one the following (a), (b) and (c):
    (a) assigning, by the scheduler, an address of a single-step interface of the at least one processor requiring debugging to a single-step interface pointer of the scheduler, and assigning the single-step interface pointer of the scheduler to a single-step interface pointer of a SIMICS simulator;
    (b) assigning, by the scheduler, an address of a status query interface of the at least one processor requiring debugging to a status query interface pointer of the scheduler, and assigning the status query interface pointer of the scheduler to a status query interface pointer of the SIMICS simulator; and (c) assigning, by the scheduler, an address of a status setting interface of the to-be-simulated processor requiring debugging to a status setting interface pointer of the scheduler, and assigning the status setting interface pointer of the scheduler to a status setting interface pointer of the SIMICS simulator.

5. The method according to claim 1, further comprising: registering, by the scheduler, a corresponding second execute interface with a SIMICS simulator, so that the scheduler is scheduled via the second execute interface to create the at least one slave thread by using the master thread.

6. The method according to claim 5, further comprising: registering, by the scheduler, a corresponding second cycle interface with the SIMICS simulator, so that the SIMICS simulator delivers a cycle parameter to the scheduler by using the master thread via the second cycle interface, and the scheduler delivers, by using the master thread and the at least one slave thread via the first cycle interface, the cycle parameter to the at least first and second processors, so as to control the scheduler to synchronously invoke, by using the master thread and the at least one slave thread, the at least first and second processors, wherein the first cycle interface registers with the scheduler through the at least first and second processors.

7. The method according to claim 1, further comprising: obtaining, by the scheduler, breakpoint information, so as to: when a running status of the processor requiring debugging satisfies the breakpoint information, trigger the scheduler to debug, by using the master thread via the debug interface of the at least one processor requiring debugging; or obtaining, by the at least one processor requiring debugging, the breakpoint information, so as to: when the running status of the at least one processor requiring debugging satisfies the breakpoint information, trigger the scheduler to debug, by using the master thread via the debug interface of the at least one processor requiring debugging.

8. A scheduler comprising a processor and a memory storing instructions for execution by the processor such that, when executed, the processor is configured to:
map debug interface information of at least one processor requiring debugging onto the scheduler by assigning an address of a debug interface of the to-be-simulated processor requiring debugging to an interface pointer of the scheduler,
wherein the interface is one of a (a) single-step interface, (b) status query interface and (c) status setting interface and the interface pointer is one of a (a) single-step interface pointer, (b) status query interface pointer and (c) status setting interface pointer;
create at least one slave thread according to a configuration file by using a master thread, and determine at least one first processor corresponding to the master thread and at least one second processor corresponding to the at least one slave thread, wherein the at least one first processor corresponding to the master thread comprises the at least one processor requiring debugging,
wherein a maximum number of the at least one second slave threads is equal to a result obtained by subtracting 1 from a number of processors of a host machine where the scheduler is located, and each slave thread corresponds to one processor of the host machine, and
wherein the configuration file comprises a number of the at least one slave thread, number information of the at least one processor requiring debugging and a mapping relationship between the at least one slave thread and the at least one second processor;
invoke, via a first execute interface by using the master thread and the at least one slave thread, the at least one first and second processors to execute a corresponding instruction;
debug, by using the master thread via the debug interface of the processor requiring debugging, wherein the first execute interface registers with the scheduler through the at least one first and second processors; and
deliver, by using the master thread and the at least one slave thread via a first cycle interface, a cycle parameter to the at least one first and second processors, so as to control the scheduler to synchronously invoke, by using the master thread and the at least one slave thread, the at least one first and second processors, wherein the first cycle interface registers with the scheduler through the at least one first and second processors.

9. The scheduler according to claim 8, wherein the processor is further configured to:
deliver, by using the master thread and the at least one slave thread via a first cycle interface, a cycle parameter to the at least one first and second processors, so as to control the scheduler to synchronously invoke, by using the master thread and the at least one slave thread, the at least one first and second processors, wherein the first cycle interface registers with the scheduler through the at least one first and second processors.

10. The scheduler according to claim 8, wherein the scheduler is in a SIMICS simulator.

11. The scheduler according to claim 10, wherein the processor is further configured to assign an address of a breakpoint control interface of the at least one processor requiring debugging to a breakpoint control interface pointer of the scheduler.

12. The scheduler according to claim 11, wherein the processor is further configured to:
assign an address of a breakpoint query interface of the scheduler to a breakpoint query interface pointer of the at least one processor requiring debugging; and
assign an address of a breakpoint trigger interface of the scheduler to a breakpoint trigger interface pointer of the at least one processor requiring debugging.

13. The scheduler according to claim 8, wherein the processor is configured to provide at least one of the following:
assign an address of a single-step interface of the at least one processor requiring debugging to a single-step interface pointer of the scheduler, and assign the single-step interface pointer of the scheduler to a single-step interface pointer of a SIMICS simulator;
assign an address of a status query interface of the at least one processor requiring debugging to a status query interface pointer of the scheduler, and assign the status query interface pointer of the scheduler to a status query interface pointer of the SIMICS simulator; and
assign an address of a status setting interface of the at least one processor requiring debugging to a status setting interface pointer of the scheduler, and assign the status setting interface pointer of the scheduler to a status setting interface pointer of the SIMICS simulator.

14. The scheduler according to claim 8, wherein the processor is further configured to register a corresponding second execute interface with a SIMICS simulator, so that the SIMICS simulator schedules the scheduler via the second execute interface to create the at least one slave thread by using the master thread.

15. The scheduler according to claim 14, wherein the processor is further configured to:
register a corresponding second cycle interface with the SIMICS simulator, so that the SIMICS simulator delivers a cycle parameter to the scheduler by using the master thread via the second cycle interface, and
deliver, by using the master thread and the at least one slave thread via the first cycle interface, the cycle parameter to the determined corresponding at least one first and second processors, so as to control the scheduler to synchronously invoke, by using the master thread and the at least one slave thread, the at least one first and second processors, wherein the first cycle interface registers with the scheduler through the at least one first and second processors.

16. The scheduler according to claim 8, wherein the processor is further configured to obtain breakpoint information, so as to:
when a running status of the at least one processor requiring debugging satisfies the breakpoint information, trigger the scheduler to debug, by using the master thread via the debug interface of the at least one processor requiring debugging.

17. A system for simulating multiple processors in parallel, comprising a scheduler, wherein the scheduler comprises a processor and memory storing instructions for execution by the processor such that the processor executes the instructions so as to configure the scheduler to:
map debug interface information of at least one processor requiring debugging onto the scheduler by assigning an address of a debug interface of the processor requiring debugging to an interface pointer of the scheduler,
wherein the interface is one of a (a) single-step interface, (b) status query interface and (c) status setting interface and the interface pointer is one of a (a) single-step interface pointer, (b) a status query interface pointer and (c) status setting interface pointer;
create at least one slave thread according to a configuration file by using a master thread, and determine at least one first processor corresponding to the master thread and at least one second processor corresponding to the at least one slave thread, wherein the at least one processor corresponding to the master thread comprises the at least one processor requiring debugging,
wherein a maximum number of the at least one slave thread is equal to a result obtained by subtracting 1 from a number of processors of a host machine where the scheduler is located, and each slave thread corresponds to one processor of the host machine, and
wherein the configuration file comprises a number of the at least one slave thread, number information of the at least one processor requiring debugging and a mapping relationship between the at least one slave thread and the at least one second processor;
invoke, via a first execute interface by using the master thread and the at least one slave thread, the at least one first and second processors to execute a corresponding instruction;
debug, by using the master thread via the debug interface of the processor requiring debugging, wherein the first execute interface registers with the scheduler through the at least one first and second processors;
deliver, by using the master thread and the at least one slave thread via a first cycle interface, a cycle parameter to the at least first and second processors, so as to control the scheduler to synchronously invoke, by using the master thread and the at least one slave thread, the at least one first and second processors, wherein the first cycle interface registers with the scheduler through the at least one first and second processors.

18. The system for simulating multiple processors in parallel according to claim 17, wherein the processor is further configured to:
deliver, by using the master thread and the at least one slave thread via a first cycle interface, a cycle parameter to the at least first and second processors, so as to control the scheduler to synchronously invoke, by using the master thread and the at least one slave thread, the at least first and second processors, wherein the first cycle interface registers with the scheduler through the at least first and second processors.

19. The system for simulating multiple processors in parallel according to claim 17, wherein the scheduler is in a SIMICS simulator.

20. The system for simulating multiple processors in parallel according to claim 17, wherein the processor is further configured to register a corresponding second execute interface with a SIMICS simulator, so that the SIMICS simulator schedules the scheduler via the second execute interface to create the at least one slave thread by using the master thread.

* * * * *

UNITED STATES PATENT AND TRADEMARK OFFICE
CERTIFICATE OF CORRECTION

PATENT NO. : 9,703,905 B2
APPLICATION NO. : 14/142567
DATED : July 11, 2017
INVENTOR(S) : Ye et al.

Page 1 of 1

It is certified that error appears in the above-identified patent and that said Letters Patent is hereby corrected as shown below:

In the Claims

Column 17, Line 29, "of the processor" should read -- of the to-be-simulated processor --.

Signed and Sealed this
Thirty-first Day of July, 2018

Andrei Iancu
*Director of the United States Patent and Trademark Office*